United States Patent
Kim et al.

(10) Patent No.: US 12,327,712 B2
(45) Date of Patent: Jun. 10, 2025

(54) HIGH VOLTAGE POWER SUPPLY APPARATUS AND PLASMA ETCHING EQUIPMENT HAVING THE SAME

(71) Applicant: SAMSUNG ELECTRONICS CO., LTD., Suwon-si (KR)

(72) Inventors: Jihwan Kim, Hwaseong-si (KR); Hyunbae Kim, Yongin-si (KR); Hongseung Cho, Hwaseong-si (KR); Seungbo Shim, Seoul (KR); Sungyeol Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 358 days.

(21) Appl. No.: 17/901,263

(22) Filed: Sep. 1, 2022

(65) Prior Publication Data

US 2023/0075642 A1 Mar. 9, 2023

(30) Foreign Application Priority Data

Sep. 8, 2021 (KR) .......... 10-2021-0119845

(51) Int. Cl.
*B32B 41/00* (2006.01)
*H01J 37/32* (2006.01)
*H01L 21/67* (2006.01)

(52) U.S. Cl.
CPC .. *H01J 37/32715* (2013.01); *H01J 37/32568* (2013.01); *H01J 37/32082* (2013.01); *H01J 2237/2007* (2013.01); *H01J 2237/334* (2013.01); *H01L 21/67167* (2013.01); *H01L 21/67219* (2013.01)

(58) Field of Classification Search
CPC .......... H01J 37/32715; H01J 37/32568; H01J 37/32082; H01J 2237/2007; H01J 2237/334; H01L 21/67167; H01L 21/67219
USPC .................... 156/60, 64, 350, 351, 378, 379
See application file for complete search history.

(56) References Cited

U.S. PATENT DOCUMENTS

| | | | |
|---|---|---|---|
| 7,095,178 B2 | 8/2006 | Nakano et al. | |
| 7,514,935 B2 | 4/2009 | Pankratz | |
| 9,844,127 B2 | 12/2017 | Bhutta | |
| 10,148,253 B2 | 12/2018 | Xu et al. | |
| 2006/0081564 A1 | 4/2006 | Moroz et al. | |
| 2012/0075108 A1 | 3/2012 | Chen et al. | |
| 2020/0035458 A1 | 1/2020 | Ziemba et al. | |
| 2020/0234925 A1* | 7/2020 | Aoki | H01J 37/32697 |

* cited by examiner

*Primary Examiner* — Michael N Orlando
*Assistant Examiner* — Joshel Rivera
(74) *Attorney, Agent, or Firm* — Muir Patent Law, PLLC

(57) ABSTRACT

A high voltage power supply apparatus includes a high voltage direct current voltage source, a power switch configured to apply an output of the high voltage direct current voltage source to process equipment, and a sensing circuit unit including a sensor unit including a sensor and at least one operational amplifier, a reference voltage detection unit connected to a node between the sensor and the at least one operational amplifier, and a digital signal processing unit, wherein the sensing circuit unit is connected to an output terminal through which an output of the high voltage direct current voltage source is applied to the process equipment.

20 Claims, 11 Drawing Sheets

HIGH VOLTAGE POWER SUPPLY APPARATUS AND PLASMA ETCHING EQUIPMENT HAVING THE SAME

CROSS TO REFERENCE TO RELATED APPLICATION

This application claims benefit of priority to Korean Patent Application No. 10-2021-0119845 filed on Sep. 8, 2021, in the Korean Intellectual Property Office, the disclosure of which is incorporated herein by reference in its entirety.

BACKGROUND

1. Field

Embodiments relate to a high voltage power supply apparatus and a plasma etching equipment having the same.

2. Description of the Related Art

An etching process may include removing a thin film from an area other than an area in which a photoresist is formed by a photolithography process. Recently, plasma has been used in a process of etching a substrate among semiconductor processes. Plasma etching may be performed by applying high energy to gaseous molecules in a vacuum state to ionize or decompose the molecules so as to activate the molecules, and colliding activated particles against the thin film to break a structure of the thin film, thereby removing the thin film.

SUMMARY

According to an embodiment, a high voltage power supply apparatus includes a high voltage direct current voltage source, a power switch configured to apply an output of the high voltage direct current voltage source to process equipment, and a sensing circuit unit including a sensor unit including a sensor and at least one operational amplifier, a reference voltage detection unit connected to a node between the sensor and the at least one operational amplifier, and a digital signal processing unit, wherein the sensing circuit unit is connected to an output terminal through which an output of the high voltage direct current voltage source is applied to the process equipment.

According to an embodiment, a high voltage power supply apparatus includes a high voltage direct current voltage source electrically connected to a lower electrode of a processing chamber and configured to apply an output to the lower electrode, and a sensing circuit unit connected to an output terminal of the high voltage direct current voltage source and including a reference voltage detection unit configured to detect an offset of a voltage applied to the lower electrode of the processing chamber, wherein, after an RF power supply configured to apply a plasma generation voltage to an upper electrode of the processing chamber is activated, the sensing circuit unit detects the offset based on a control signal applied before the high voltage direct current voltage source is activated.

According to an embodiment, plasma etching equipment includes a processing chamber including an upper electrode and a lower electrode, where a substrate on which a process is performed is disposed on the lower electrode, a processing gas supply unit configured to supply a processing gas to the processing chamber, an RF power supply configured to apply a first voltage to the upper electrode to convert the processing gas into a plasma state, and a high voltage power supply apparatus including a sensing circuit unit connected between the lower electrode and a ground terminal and configured to apply, to the lower electrode, a second voltage compensated based on an offset voltage of the lower electrode detected by the sensing circuit unit.

BRIEF DESCRIPTION OF DRAWINGS

Features will become apparent to those of skill in the art by describing in detail example embodiments with reference to the attached drawings in which.

DETAILED DESCRIPTION

Figure 1:
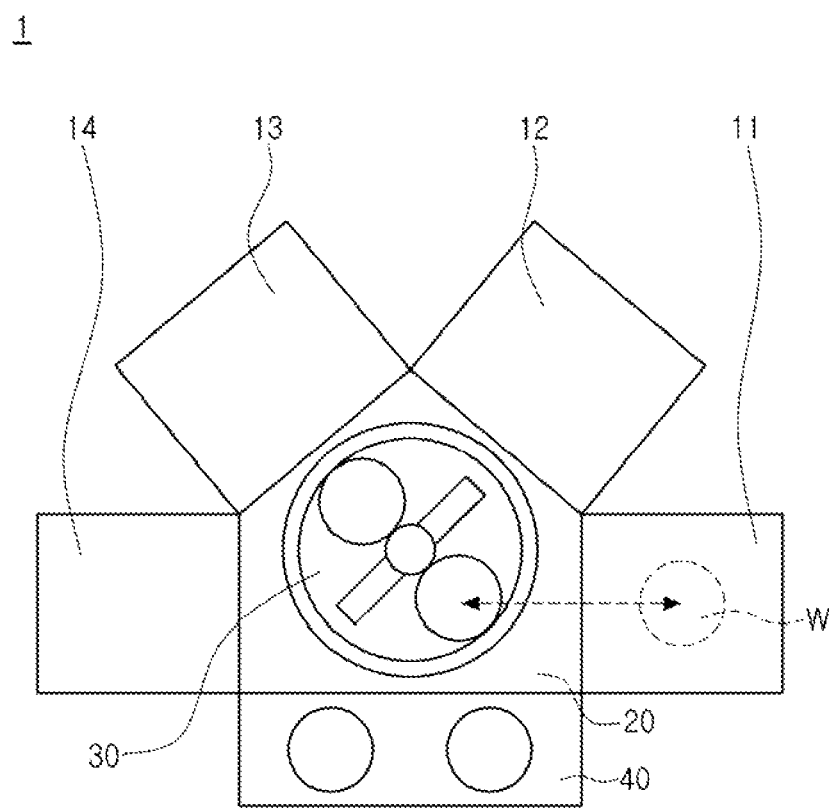
FIG. 1 is a diagram illustrating a semiconductor processing facility including plasma etching equipment according to an example embodiment.

FIG. 1 is a diagram illustrating semiconductor processing facility including a plasma etching equipment according to an example embodiment.

Referring to FIG. 1, a semiconductor process facility 1 including plasma etching equipment in an example embodiment may include a plurality of processing chambers 11-14 configured to perform a semiconductor process with respect to a substrate W. For example, the plurality of processing chambers 11-14 may include a deposition processing chamber for performing a deposition process, a polishing processing chamber for performing a chemical mechanical polishing (CMP) process, and an etching processing chamber for removing at least a portion of device layers included in the substrate W using an etchant or plasma formed from radicals and ions of a source gas. The plurality of processing chambers 11-14 may further include an inspection processing chamber for inspecting the substrate W while the process is performed or after the process is completed.

The semiconductor process facility illustrated in FIG. 1 may include a single processing chamber for each semiconductor process, or a semiconductor processing facility may include a plurality of processing chambers for each semiconductor process. A production yield for semiconductor chips may be determined according to the number of the processing chambers, and the number of the plurality of processing chambers may be varied.

The substrate W may be a semiconductor substrate on which a semiconductor process is performed, and may be a wafer formed of a semiconductor material such as silicon. Semiconductor devices, wiring patterns connected to the semiconductor devices, and insulating layers covering the semiconductor devices and the wiring patterns may be formed on the substrate W by semiconductor processes performed in the plurality of processing chambers 11-14. A plurality of semiconductor chips may be produced from the substrate W.

The plurality of processing chambers 11-14 may receive the substrate W through a transfer chamber 20 and a load lock chamber 40 to perform a semiconductor process. The transfer chamber 20 and the load lock chamber 40 may include a transfer robot 30. The transfer robot 30 of the transfer chamber 20 and the load lock chamber 40 may transfer the substrate W, which may be a processing object. For example, the transfer robot 30 of the transfer chamber 20 may remove a processing object such as the substrate W from the load lock chamber 40 and may transfer the processing object to the plurality of processing chambers 11-14, or the transfer robot 30 may transfer the processing object between the plurality of processing chambers 11-14. In an example embodiment, the transfer robot may be a handler.

The transfer robot 30 may include a chuck for fixing the processing object and a linear stage for transferring the processing object. The chuck may be an electrostatic chuck (ESC) which may fix a processing object using electrostatic force. A plurality of protrusions may be formed on the electrostatic chuck and may be in contact with the processing object.

Referring to FIG. 1, in the semiconductor process facility 1 including a high voltage power supply apparatus in an example embodiment, the transfer robot 30 of the transfer chamber 20 may remove the substrate W from the load lock chamber 40 and may transfer the substrate W to the transfer chamber 20, such that the substrate W, which is a processing object, is transferred to the processing chamber 11. The substrate W may be various substrates, other than a wafer, such as a mother substrate for a display.

At least one processing chamber 11 of the processing chambers 11-14 may be allocated as a chamber for performing an etching process. In an example embodiment, the processing chamber 11 may be a plasma processing chamber for removing a portion of a thin film formed on an upper surface of the substrate W using plasma. In the plasma etching equipment, each of the plasma processing chambers may receive a high voltage for the etching process from the high voltage power supply apparatus.

Figure 2:
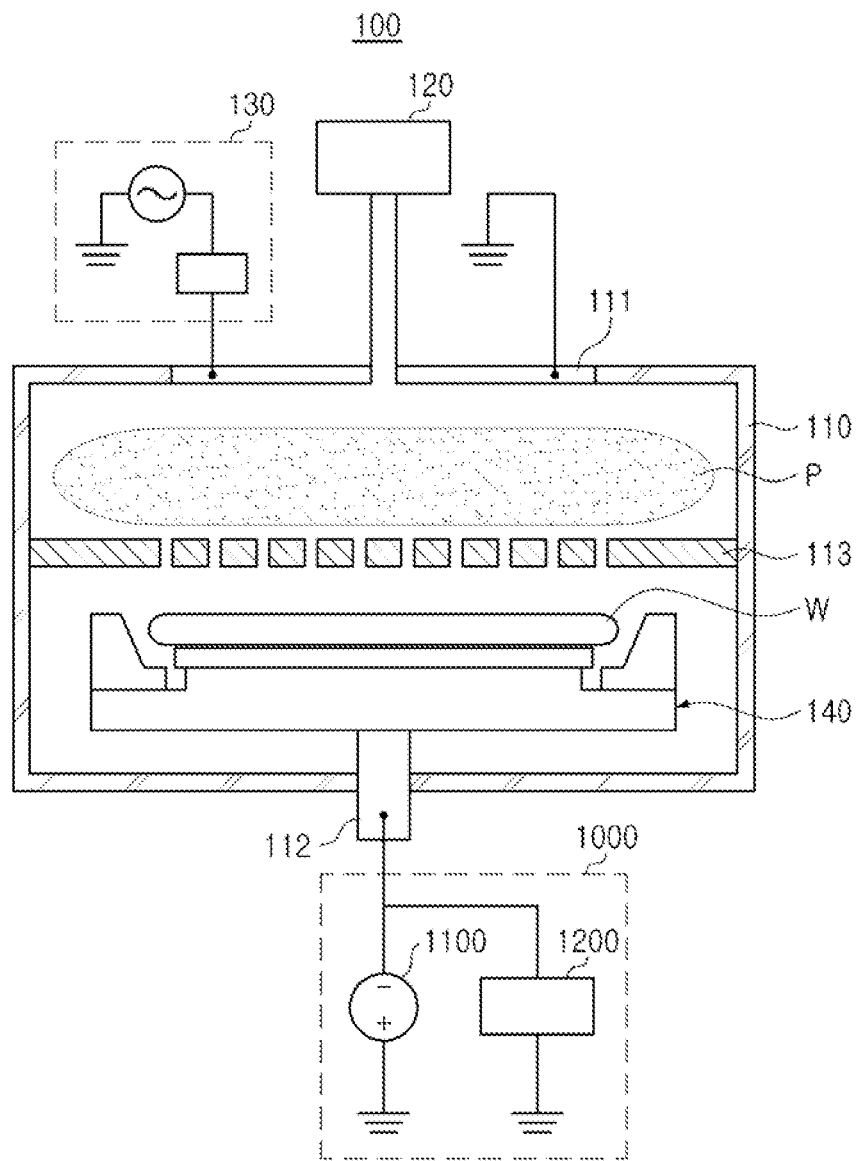
FIG. 2 is a diagram illustrating plasma etching equipment including a high voltage power supply apparatus according to an example embodiment.

FIG. 2 is a diagram illustrating plasma etching equipment including a high voltage power supply apparatus according to an example embodiment.

Referring to FIG. 2, a plasma etching equipment 100 in an example embodiment may include a processing chamber 110, a processing gas supply unit 120, an RF power supply 130, a lower structure 140, and a high voltage power supply apparatus 1000.

The plasma etching equipment 100 may further include a cooling device, an exhaust unit, a controller, not illustrated.

The processing chamber 110 may work as a housing forming an internal space defined by an outer wall. The internal space may be used to perform an etching process for processing the substrate W (the processing object) by converting a processing gas P supplied by the processing gas supply unit 120 into a plasma state. The outer wall may be formed of a material having excellent wear resistance and corrosion resistance. The processing chamber 110 may maintain the internal space in a closed state having a predetermined pressure and temperature in a plasma processing process, such as an etching process. A pump for exhausting gas in the internal space may be disposed in a region of the outer wall.

The processing chamber 110 may include an upper electrode 111, a lower electrode 112, and an induction electrode 113. The internal space of the processing chamber 110 may be divided by the induction electrode 113. The processing gas supply unit 120 may supply the processing gas P to the internal space between the upper electrode 111 and the induction electrode 113. The substrate W may be disposed between the induction electrode 113 and the lower electrode 112. The etching process may be performed by action of the processing gas P in a plasma state.

The processing gas supply unit 120 may supply the processing gas P for performing the plasma etching process to the internal space of the processing chamber 110. The processing gas P may include $O_2$, $Cl_2$, $SF_6$, or the like.

The upper electrode 111 illustrated in FIG. 2 is merely an example, and the processing gas supply unit 120 may be configured to be connected to the upper electrode 111. In this case, the upper electrode 111 may be a shower-shaped electrode, and the processing gas P supplied from the processing gas supply unit 120 may be sprayed into the processing chamber 110 through an injection hole of the upper electrode 111. Also, the upper electrode 111 may be disposed on the side of the processing chamber 110 in example embodiments.

The supplied processing gas P may be converted into a plasma state by the power supplied from the RF power supply 130. The RF power supply 130 may be connected to the upper electrode 111, and may supply a first voltage for plasma formation to the upper electrode 111. For example, the first voltage output from the RF power supply 130 may be supplied to the upper electrode 111 through an impedance matcher.

In the plasma etching process, the upper electrode 111 and the lower electrode 112 may form reflected power. As the reflected power increases, the total output for plasma formation may decrease. Accordingly, the impedance matcher may reduce the reflected power by matching the impedance of the circuit and the power supply. In the plasma etching equipment 100 illustrated in FIG. 2, the impedance matcher may be included only in the RF power supply 130, but this may be varied.

In the plasma etching equipment 100 in an example embodiment, the supplied first voltage may be an RF voltage. The RF voltage may form a high-frequency electric field between the upper electrode 111 and the induction electrode 113. The high-frequency electric field may excite the processing gas P supplied into the processing chamber 110 into a plasma state. The processing gas P excited to a plasma state may be sprayed onto the upper surface of the substrate W disposed in the processing chamber 110 through a gas spraying device.

The lower structure 140 may include an electrostatic chuck. For example, the electrostatic chuck may be disposed in the processing chamber 110 in which the plasma etching process is performed, and may fix the substrate W to the upper surface of the electrostatic chuck using static electricity.

The lower structure 140 further may include an edge ring used to control the temperature in the edge region of the substrate W when the temperature of the substrate W increases due to heat generated during the plasma etching process. For example, the edge ring may be spaced apart from the side surface of the substrate W and may surround the side surface of the substrate W.

In the plasma etching equipment 100 in an example embodiment, the electrostatic chuck may operate as the lower electrode 112 to which a voltage is applied from a high voltage power supply apparatus. The lower electrode 112 may have a circular planar shape to support the substrate W having a circular shape.

The lower electrode 112 may receive direct current (DC) power, having a polarity different from that of the induction electrode 113, from the high voltage power supply apparatus 1000. The high voltage power supply apparatus 1000 may supply a second voltage for performing an etching process to the lower electrode 112, which may be an electrostatic chuck. The high voltage power supply apparatus 1000 may be a bias power supply outputting the second voltage.

In the plasma etching equipment 100 in an example embodiment, the RF power supply 130 may excite the processing gas P supplied into the processing chamber 110 into a plasma state, and the high voltage power supply apparatus 1000 may make ions incident onto the substrate W to perform an etching process.

The high voltage power supply apparatus 1000 in an example embodiment may include a high voltage DC voltage source 1100 and a sensing circuit unit 1200. Each of the high voltage DC voltage source 1100 and the sensing circuit unit 1200 may be connected between the lower electrode 112 and a ground terminal.

The sensing circuit unit 1200 may detect an offset voltage of the lower electrode 112 and may compensate for the offset voltage. Accordingly, the high voltage DC voltage source 1100 may apply the second voltage to the lower electrode 112 based on the compensated sensing voltage.

Figure 3:
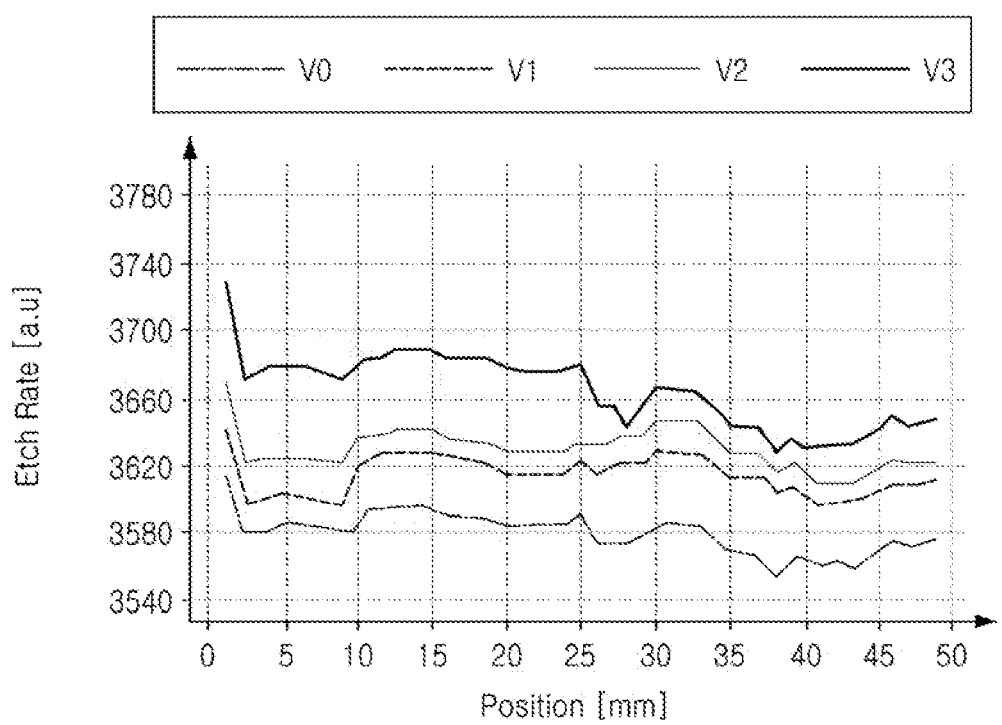
FIG. 3 is a diagram illustrating an etching rate according to an output of a high voltage power supply apparatus according to an example embodiment.

FIG. 3 is a diagram illustrating an etching rate according to an output of a high voltage power supply apparatus according to an example embodiment.

Referring to FIG. 3, an etching rate of the plasma etching equipment 100 may be varied according to dispersion of the output distribution of the high voltage power supply apparatus 1000.

For example, V0 may be a normal output from the high voltage power supply apparatus 1000, and V1 to V3 may be outputs of when a deviation occurs in the output from the high voltage power supply apparatus 1000. As an example, V1, V2, and V3 may be obtained by varying the magnitude of the normal output by 2%, 3%, and 5%, respectively. When comparing the etching rates of a central portion of the substrate W, when V1 is applied, the etching rate may be reduced by about 0.7% as compared to when V0 is applied. Also, when V2 is applied, the etching rate may decrease by about 1.1% as compared to when V0 is applied, and when V3 is applied, the etching rate may decrease by about 2.7% as compared to when V0 is applied.

When dispersion of the etching rate distribution in the plasma etching process increases, the defect rate of the semiconductor device produced through the plasma etching process may increase. Therefore, it may be important to accurately sense the voltage output from the high voltage power supply apparatus 1000.

When the semiconductor process facility 1 includes a plurality of plasma etching equipments 100, the voltage output from the high voltage power supply apparatus 1000 connected to each of the plurality of plasma etching equipments 100 may not exactly match. Accordingly, there may be a difference in etching rates for the substrate W in the plurality of plasma etching equipment 100. Since the difference in the etching rates may lead to an increase in dispersion of process distribution, an increase in the difference in the etching rates may cause an increase in the defect rate of the semiconductor device manufactured from the substrate W.

Figure 4:
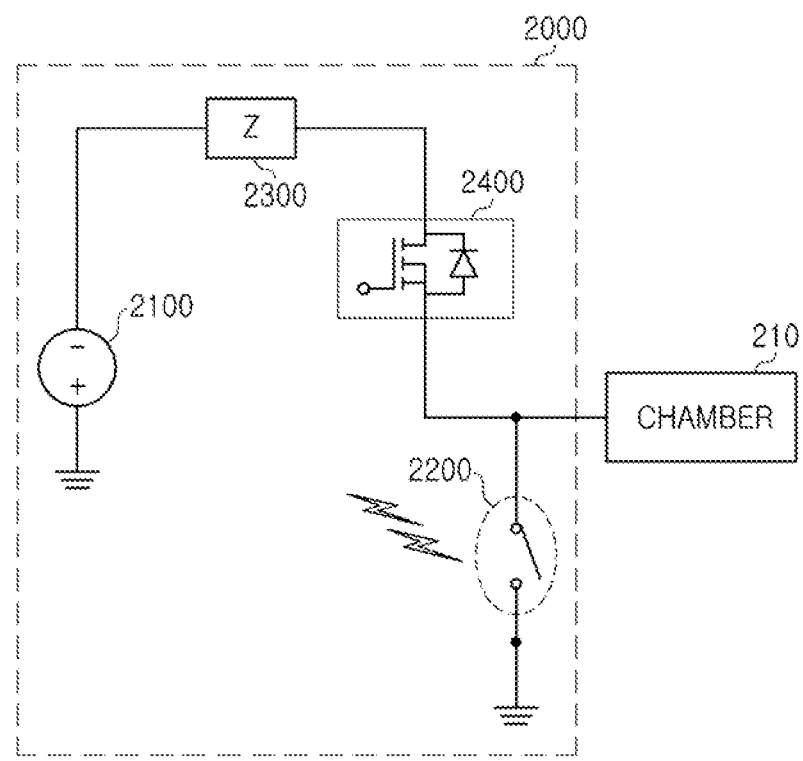
FIG. 4 is a circuit diagram illustrating a configuration of a general high voltage power supply apparatus.

FIG. 4 is a circuit diagram illustrating a configuration of a general high voltage power supply apparatus.

To selectively control ion energy and to improve straightness of ions in the plasma etching equipment, a power supply having a non-sinusoidal output and a power supply apparatus that outputs a high voltage of 4 kV or more may be called for, depending on film quality of a thin film.

Difference of the voltage distribution between power supply apparatuses having a non-sinusoidal output may be closely related to the dispersion of process distribution. Accordingly, to address the dispersion of process distribution issue described in FIG. 3, a process of detecting an offset voltage in the node between the high voltage power supply apparatus 1000 and the processing chamber 110, i.e., an output terminal of the high voltage power supply apparatus 1000, and compensating for the offset voltage, may be employed.

For example, after an offset voltage is detected in the output terminal of the high voltage power supply apparatus 1000, the voltage may be output by being reduced by the offset voltage detected from the target output power supply, such that output from the high voltage power supply apparatus 1000 may be maintained at the same level.

Referring to FIG. 4, a general high voltage power supply apparatus 2000 connected to a processing chamber 210 may include a high voltage DC voltage source 2100 and a power switch 2400 for applying the output of the high voltage DC voltage source 2100 to the processing chamber 210. For example, the high voltage DC voltage source 2100 and the power switch 2400 may be connected to the processing chamber 210 in series.

The general high voltage power supply apparatus 2000 may further include a loss reduction block 2300 for reducing switching loss of the power switch 2400. For example, the loss reduction block 2300 may include devices having impedance of a predetermined magnitude.

To address the dispersion of process distribution issue in the general high voltage power supply apparatus 2000, a zero voltage switch 2200 for detecting the offset voltage may be connected to the output terminal, through which the output of the high voltage DC voltage source 2100 is applied to the processing chamber 210.

In the general high voltage power supply apparatus, when a high voltage is required as in the plasma etching equipment, when the zero voltage switch 2200 is connected, there may be a limitation in detecting the offset voltage due to insulation breakdown and/or breakdown voltage issues. For example, when a high voltage is applied to both ends of the zero voltage switch 2200 while the zero voltage switch 2200 is turned off, breakdown of the insulation state of the zero voltage switch 2200 may occur.

Also, when the zero voltage switch 2200 having a high ability to withstand voltage is used to prevent the insulation breakdown at high voltage, the zero voltage switch 2200 may have a large volume, such that the integration of plasma etching equipment may be difficult.

Therefore, there may be difficulties in applying a high voltage power supply apparatus having a function of detecting and compensating for an offset voltage in the general plasma etching equipment.

Figure 5:
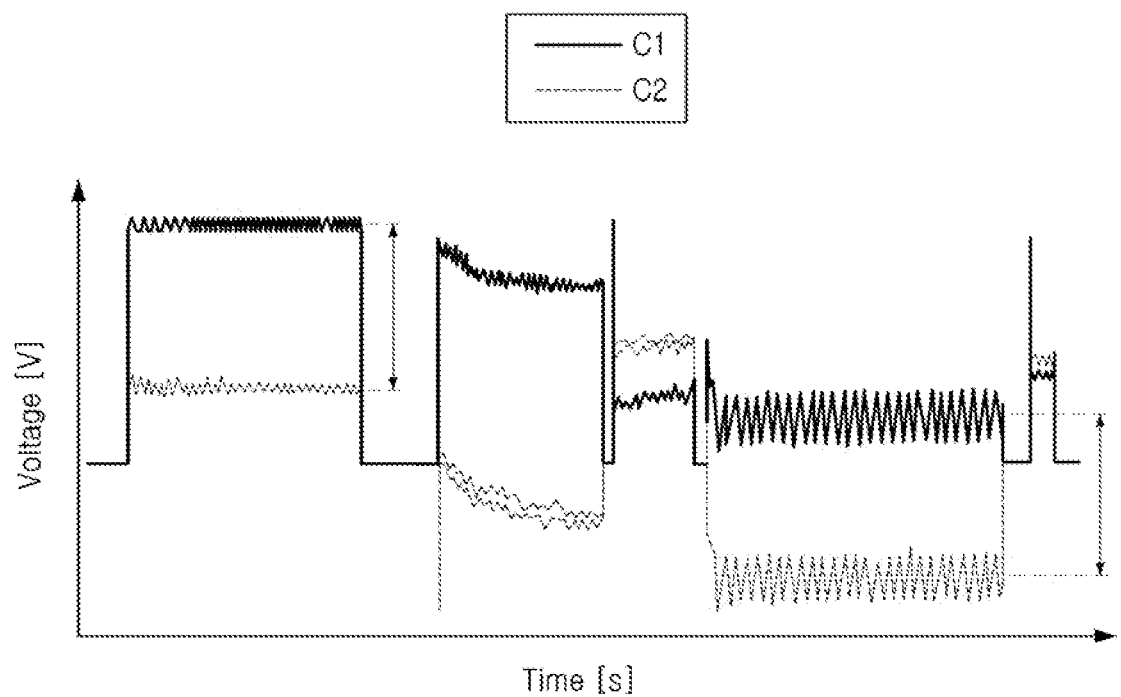
FIG. 5 is a diagram illustrating operations of a general high voltage power supply apparatus.

FIG. 5 is a diagram illustrating operations of a general high voltage power supply apparatus.

Referring to FIG. 5, the voltage applied to the plasma etching equipment may be varied depending on the surrounding environment and/or conditions. For example, the voltage applied from the high voltage power supply apparatus may be varied depending on a temperature around the plasma etching equipment, a ground environment, a noise environment, and the like.

In FIG. 5, graph C1 illustrates changes in sensing voltage after the high voltage power supply apparatus is deactivated, and graph C2 illustrates changes in sensing voltage before the high voltage power supply apparatus is deactivated.

As illustrated, the magnitude of the sensed voltage may be varied depending on whether the power supply apparatus is deactivated. Accordingly, when a high voltage power supply apparatus is applied to the general plasma etching equipment, the degree of dispersion of voltage output distribution may be deteriorated according to a difference in the surrounding environment and/or conditions between the processing equipment. Further, deterioration of the degree of dispersion of voltage output distribution may cause an issue in dispersion of process distribution. Also, such an issue may occur in plasma etching equipment and also in other semiconductor processing facilities to which a high voltage power supply apparatus is applied.

Figure 6:
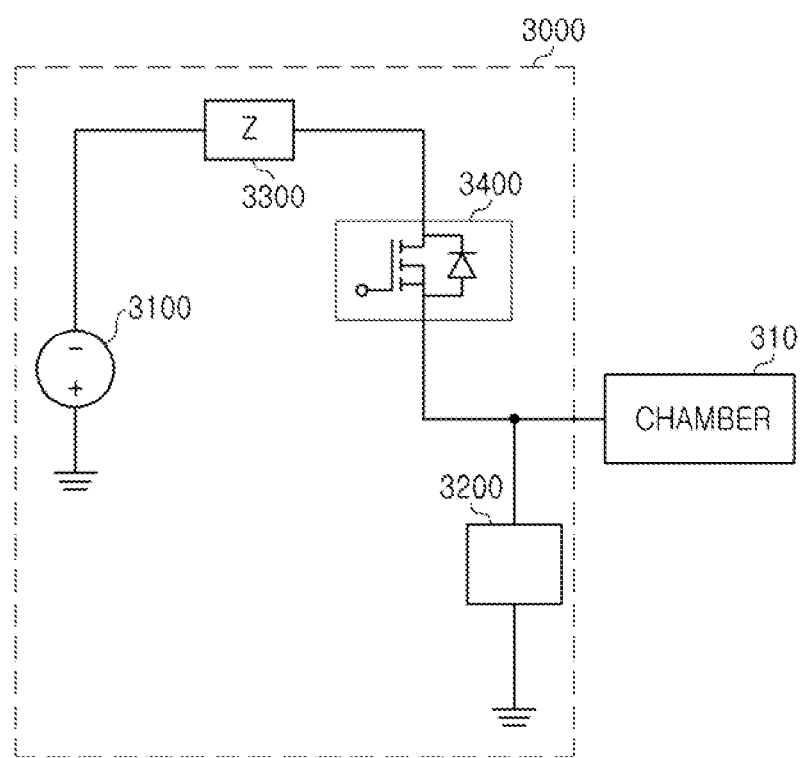
FIG. 6 is a diagram illustrating a configuration of a high voltage power supply apparatus according to an example embodiment.

FIG. 6 is a diagram illustrating a configuration of a high voltage power supply apparatus according to an example embodiment.

Referring to FIG. 6, a high voltage power supply apparatus 3000 in an example embodiment may include the components corresponding to those of the general high voltage power supply apparatus 2000 illustrated in FIG. 4, and may include a sensing circuit unit 3200 connected to an output terminal through which an output of a high voltage DC voltage source 3100 is applied to a processing chamber 310.

The high voltage power supply apparatus 3000 in an example embodiment may include a high voltage DC voltage source 3100 and a power switch 3400 for applying outputs of the high voltage DC voltage source 3100 to the processing chamber 310, and may further include a loss reduction block 3300 for reducing switching loss of the power switch 3400. The high voltage DC voltage source 3100, the loss reduction block 3300, and the power switch 3400 may be connected to the processing chamber 310 in series.

The power switch 3400 may be implemented as a semiconductor power switch, such as a MOSFET switch, an insulated gate bipolar transistor (IGBT), or a silicon carbide (SiC) switch.

The sensing circuit unit 3200 included in the high voltage power supply apparatus 3000 in an example embodiment may include a sensor unit, a reference voltage detection unit, and a digital signal processing unit.

The reference voltage detection unit may detect an offset voltage in a node between the high voltage power supply apparatus 3000 and the processing chamber 310, and may compensate for the offset voltage, thereby applying same level of voltage to the processing chamber 310.

The processing chamber 310 may be implemented as an etching chamber for performing a plasma etching process. The processing chamber 310 illustrated in FIG. 6 may include various processing chambers using an etching chamber and also the high voltage power supply apparatus 3000.

Figure 7:
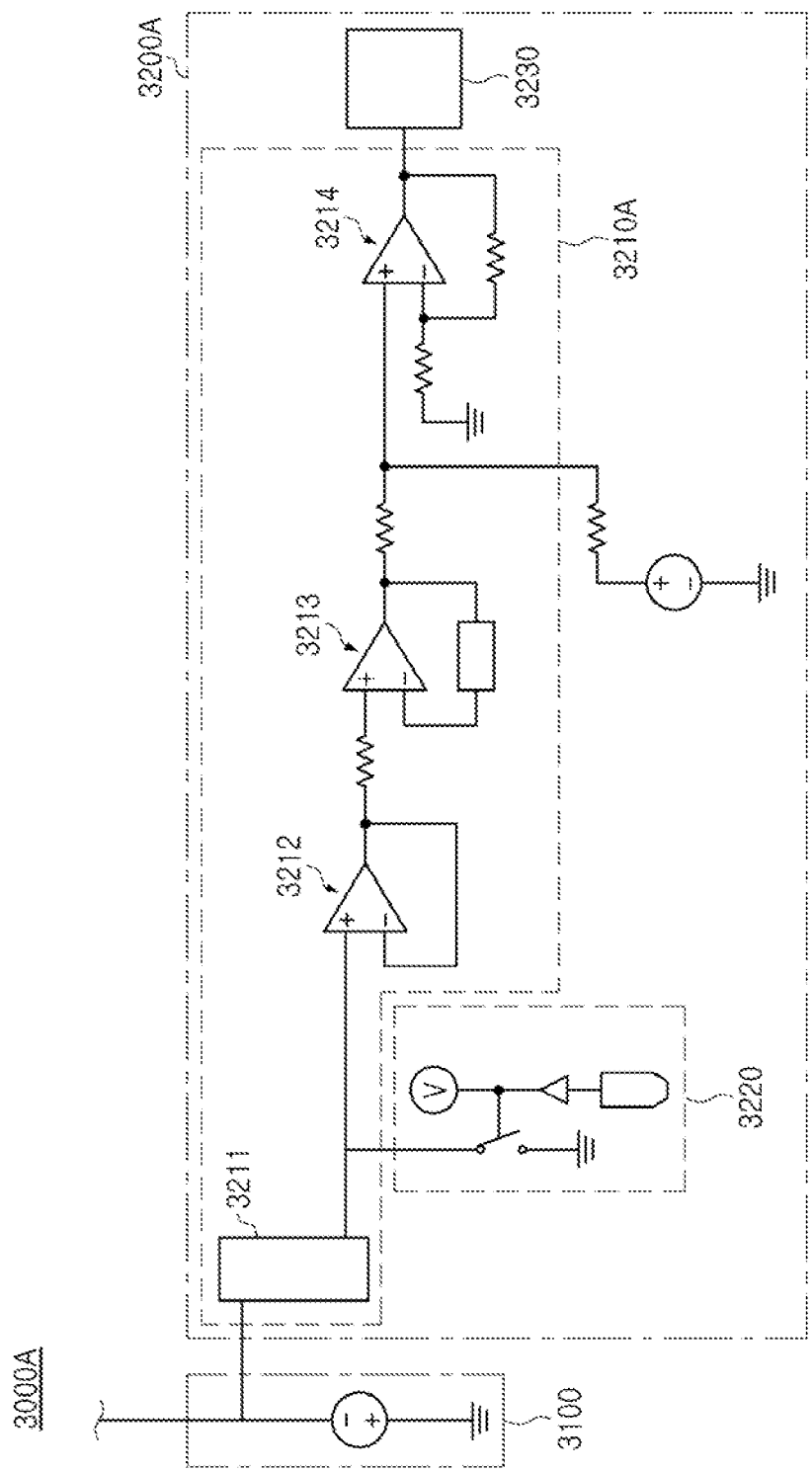
FIG. 7 is a circuit diagram illustrating a high voltage power supply apparatus according to an example embodiment.

FIG. 7 is a circuit diagram illustrating a high voltage power supply apparatus according to an example embodiment.

Referring to FIG. 7, a high voltage power supply apparatus 3000A in an example embodiment may include a high voltage DC voltage source 3100 and a sensing circuit unit 3200A.

The high voltage DC voltage source 3100 may be electrically connected to the lower electrode of the processing chamber, and may apply an output to the lower electrode.

The sensing circuit unit 3200A may be connected to an output terminal through which an output of the high voltage DC voltage source 3100 is applied to the processing chamber.

The sensing circuit unit 3200A may include a sensor unit 3210A, a reference voltage detection unit 3220, and a digital signal processing unit 3230.

The sensor unit 3210A may include a sensor 3211 and at least one operational amplifier, e.g., operational amplifiers 3212, 3213, and 3214. The reference voltage detection unit 3220 may be connected to a node between the sensor 3211 and at least one of the operational amplifiers 3212, 3213, and 3214.

The high voltage power supply apparatus 3000A in an example embodiment may be configured as a circuit for detecting an offset voltage using the sensing circuit unit 3200A when it is difficult to directly connect the zero voltage to the output terminal.

The sensor 3211 included in the sensor unit 3210A may be configured as a sensor having an attenuation ratio of about 5000:1. The sensor 3211 may be configured in various structures having a reduced dielectric breakdown issue and a small volume.

The output of the sensor 3211 may pass through at least one of the operational amplifiers 3212, 3213, and 3214, and may be applied to the digital signal processing unit 3230 for processing data.

The operational amplifiers 3212, 3213, and 3214 may respectively correspond to a first operational amplifier 3212 operating as a buffer, a second operational amplifier 3213 operating as a non-inverting operational amplifier including an impedance device, and a third operational amplifier 3214 operating as a non-inverting operational amplifier including resistor elements. However, the configuration of the at least one operational amplifier 3212, 3213, and 3214 illustrated in FIG. 7 and the connection therebetween may be varied.

The first operational amplifier 3212 may be connected to the output terminal of the sensor 3211, and may output the input impedance applied from the sensor 3211 in a high impedance state (Hi-Z).

The second operational amplifier 3213 may include an impedance device for adjusting the sensing level of the sensing circuit unit 3200A.

The reference voltage detection unit 3220 included in the high voltage power supply apparatus 3000A in an example embodiment may include a reference voltage detection switch for detecting the reference voltage. The reference voltage detection switch may be configured to have advantages in voltage attenuation, lifespan, and volume characteristics. For example, the reference voltage detection switch may be implemented as a photoMOS relay having a low ON resistance, a long lifespan, and a small volume. A switch control signal generated by the digital signal processing unit 3230 may be applied to the reference voltage detection switch. The switch control signal may turn the reference voltage detection switch on and off to detect an offset voltage while a semiconductor process is performed.

Figure 8:
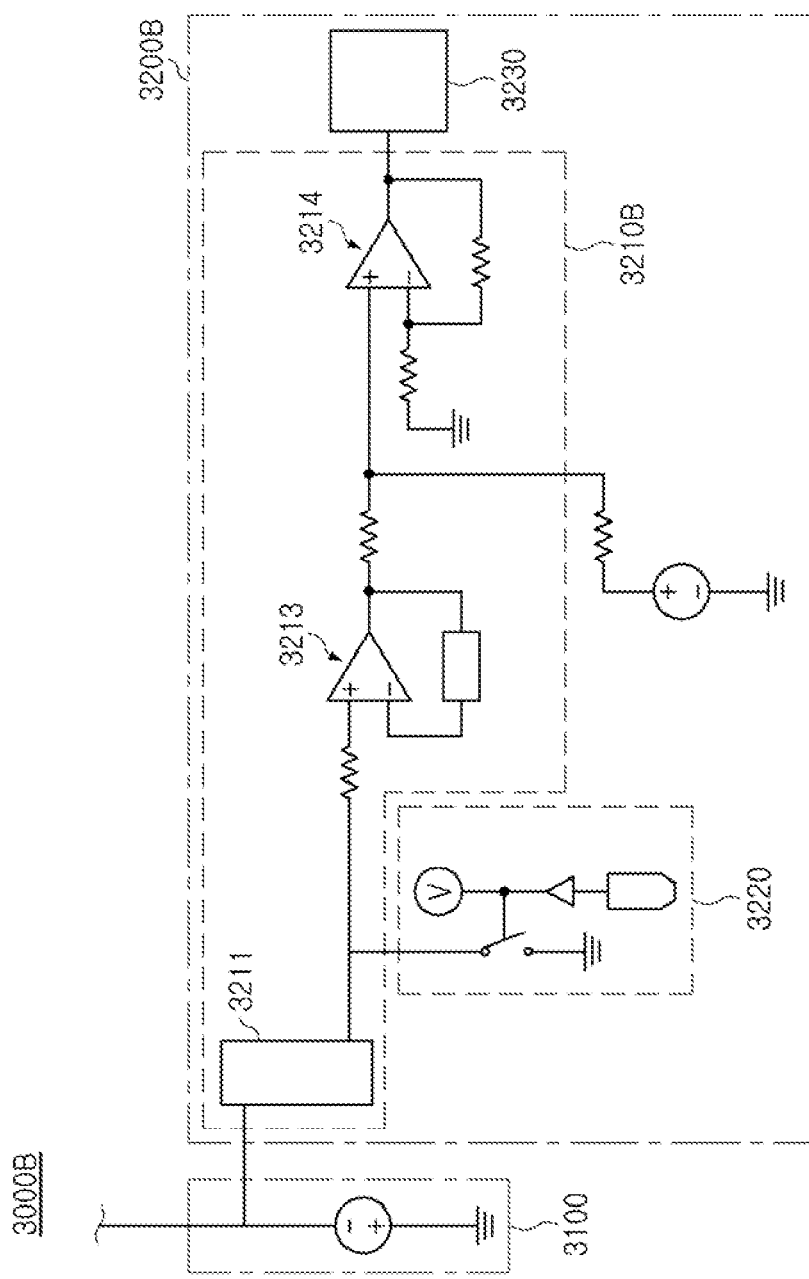
FIG. 8 is a circuit diagram illustrating a high voltage power supply apparatus according to another example embodiment.
Figure 9:
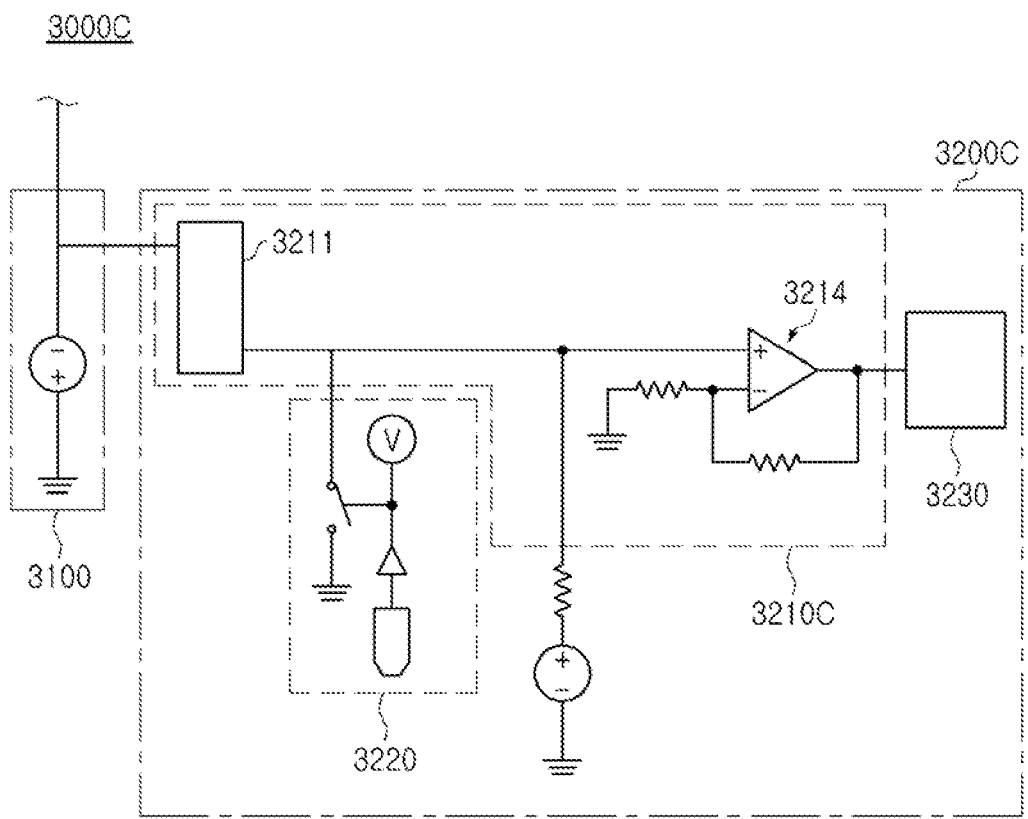
FIG. 9 is a circuit diagram illustrating a high voltage power supply apparatus according to another example embodiment.

FIG. 8 is a circuit diagram illustrating a high voltage power supply apparatus according to another example embodiment. FIG. 9 is a circuit diagram illustrating a high voltage power supply apparatus according to another example embodiment.

High voltage power supply apparatuses 3000B and 3000C in the example embodiments illustrated in FIGS. 8 and 9 may be modified examples of the high voltage power supply apparatus 3000A illustrated in FIG. 7. For example, each of the high voltage power supply apparatuses 3000B and 3000C may include components corresponding to the high voltage DC voltage source 3100, the sensor 3211, the reference voltage detection unit 3220, and the digital signal processing unit 3230 of the high voltage power supply apparatus 3000A.

Referring to FIG. 8, the high voltage power supply apparatus 3000B in an example embodiment may include a sensing circuit unit 3200B in which the first operational amplifier 3212 operating as a buffer in the high voltage power supply apparatus 3000A illustrated in FIG. 7 is not provided. Accordingly, the reference voltage detection unit 3220 may be connected to a node between the sensor 3211 and the second operational amplifier 3213. In other words, the reference voltage detection unit may be connected to the output terminal of the sensor 3211 without changing the existing output terminal.

Referring to FIG. 9, the high voltage power supply apparatus 3000C in an example embodiment may include a sensing circuit unit 3200C in which the first operational amplifier 3212 operating as a buffer in the high voltage power supply apparatus 3000A illustrated in FIG. 7 and the second operational amplifier 3213 including the impedance device are not provided. Accordingly, the reference voltage detection unit 3220 may be connected to a node between the sensor 3211 and the third operational amplifier 3214. In other words, the reference voltage detection unit may be connected to the output terminal of the sensor 3211 without changing the existing output terminal.

Figure 10:
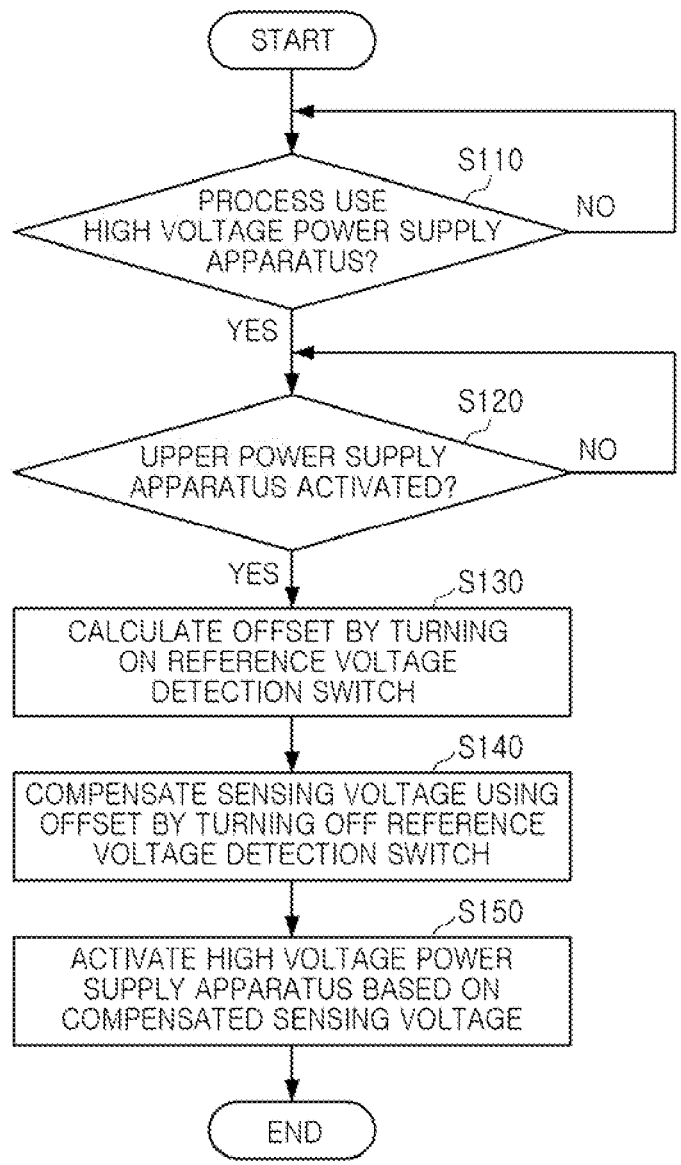
FIG. 10 is a flowchart illustrating operations of a high voltage power supply apparatus according to an example embodiment.

FIG. 10 is a flowchart illustrating operations of a high voltage power supply apparatus according to an example embodiment.

FIG. 10 is a flowchart illustrating operations that may be used for the high voltage power supply apparatuses 3000A, 3000B, and 3000C in example embodiments illustrated in FIGS. 7 to 9.

Referring to FIG. 10, the high voltage power supply apparatuses 3000A, 3000B, and 3000C in example embodiments may be applied to overall processes using a high voltage power supply. Accordingly, the high voltage power supply apparatuses 3000A, 3000B, and 3000C may determine whether a corresponding process needs to use the high voltage power supply apparatus, and appropriate control may be applied accordingly (S110).

When the corresponding process uses a high voltage power supply apparatus, the sensing circuit units 3200A, 3200B, and 3200C included in the high voltage power supply apparatuses 3000A, 3000B, and 3000C may start operation depending on whether the upper power supply apparatus connected to the upper electrode of the processing chamber, i.e., for example, the RF power supply is activated (S120). For example, the sensing circuit units 3200A, 3200B, and 3200C connected to the output terminal of the high voltage DC voltage source 3100 may detect the offset of the voltage applied to the lower electrode of the processing chamber using the reference voltage detection unit.

In the high voltage power supply apparatuses 3000A, 3000B, and 3000C in an example embodiment, after the RF power supply for applying a plasma generation voltage to the upper electrode of the processing chamber is activated, the sensing circuit unit 3200A, 3200B, or 3200C may detect the offset voltage based on a control signal applied before the high voltage DC voltage source 3100 is activated.

For example, the reference voltage detection unit 3220 included in the sensing circuit units 3200A, 3200B, and 3200C may include a reference voltage detection switch, and the reference voltage detection switch may be controlled to be turned on and off by the switch control signal in response to whether the RF power supply and the high voltage DC voltage source 3100 are activated.

The control signal for activating the RF power supply may be applied from a controller for controlling the plasma etching equipment including the high voltage power supply apparatuses 3000A, 3000B, and 3000C. To secure a time for detecting and compensating for the offset voltage, the RF power supply may be activated preemptively than the high voltage power supply apparatuses 3000A, 3000B, and 3000C. That is, the RF power supply and the high voltage power supply apparatuses 3000A, 3000B, and 3000C may be activated by a separate control signal to output an output voltage.

In the high voltage power supply apparatuses 3000A, 3000B, and 3000C in an example embodiment, after the RF power supply is activated, the reference voltage detection switch may be turned on by the switch control signal (S130). The high voltage power supply apparatuses 3000A, 3000B, and 3000C may calculate the offset for a predetermined period of time when the reference voltage detection switch is turned on. For example, a voltage detected by the sensor 3211 after the reference voltage detection switch is turned on may be an offset voltage.

As an example, the time required for calculating the offset may be between about 18 ms and 22 ms. The offset voltage may be determined as an average value of voltages detected for a predetermined period of time.

The structures of the sensing circuit units 3200A, 3200B, and 3200C may be varied, and the time for calculating the offset may be varied depending on the structures of the sensing circuit units 3200A, 3200B, and 3200C. Also, the offset may be determined in a different manner, other than the average value of the voltages detected for a predetermined period of time.

In the high voltage power supply apparatuses 3000A, 3000B, and 3000C in an example embodiment, after the predetermined period of time for the offset calculation has elapsed, the reference voltage detection switch may be turned off by the switch control signal (S140). The sensing circuit units 3200A, 3200B, and 3200C may compensate for the sensing voltage using the calculated offset when the reference voltage detection switch is turned off. For example, the voltage output from the high voltage power supply apparatuses 3000A, 3000B, and 3000C may be reduced by the calculated offset voltage, and may be compensated to be output.

After the sensing voltage is compensated, the high voltage power supply apparatuses 3000A, 3000B, and 3000C in an example embodiment may be activated by a control signal (S150). In this case, the control signal may be applied from a controller for controlling the plasma etching equipment including the high voltage power supply apparatuses 3000A, 3000B, and 3000C.

The high voltage DC voltage source 3100 included in the activated high voltage power supply apparatuses 3000A, 3000B, and 3000C may apply an output to the lower electrode of the processing chamber based on the compensated sensing voltage. In this case, the output voltages output from the high voltage power supply apparatuses 3000A, 3000B, and 3000C may be maintained at the same level.

Figure 11:
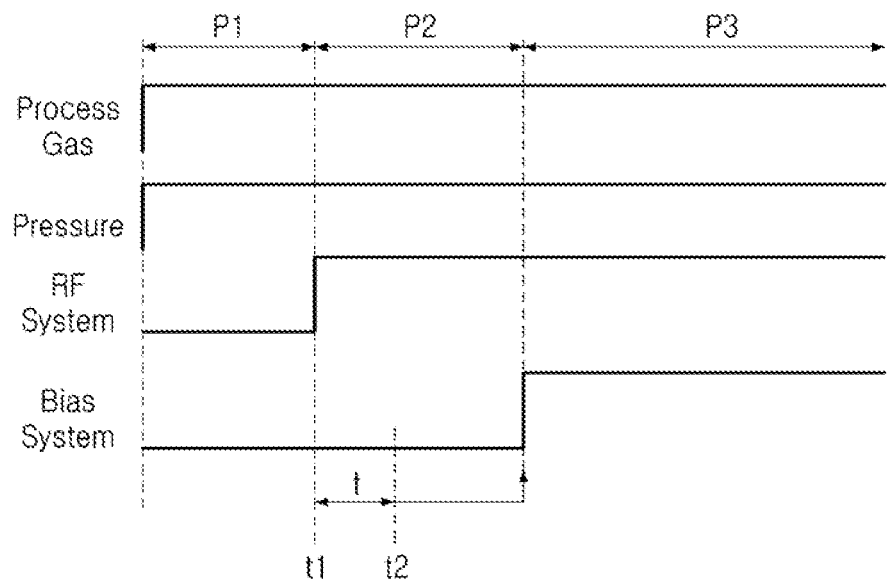
FIG. 11 is a timing diagram illustrating operations of a high voltage power supply apparatus according to an example embodiment.

FIG. 11 is a timing diagram illustrating operations of a high voltage power supply apparatus according to an example embodiment.

Referring to FIG. 11, for the plasma etching process, a first period P1 (for composing an atmosphere of the processing chamber before the process is started), a second period P2 (in which the RF power supply is activated and an offset voltage is detected), and a third period P3 (in which a bias power apparatus, such as the high voltage power supply apparatus, may be activated and a compensated voltage may be output to perform an etching process) may be performed in order.

For example, in the first period P1, the processing gas supply unit may supply a processing gas for performing a process into the processing chamber, and may maintain the internal pressure of the processing chamber at a predetermined level. In this case, the optimal supply amount of the processing gas and the internal pressure of the processing chamber may be varied depending on a process.

The second period P2 and the third period P3 may be processing periods. The plasma etching equipment in an example embodiment may detect and compensate for an offset voltage through the processes S130 and S140 illustrated in FIG. 10 when RF power supply is activated in the second period P2. As described above, the offset voltage may be determined as an average value of voltages detected for a predetermined period of time t between a first time point t1 at which the reference voltage detection switch is turned on and the second time point t2 at which the reference voltage detection switch is turned off.

After the offset voltage is detected and compensated for, the high voltage power supply apparatus may be activated in the third period P3, and may apply a bias voltage of a predetermined level to the lower electrode of the processing chamber and may perform an etching process.

Figure 12:
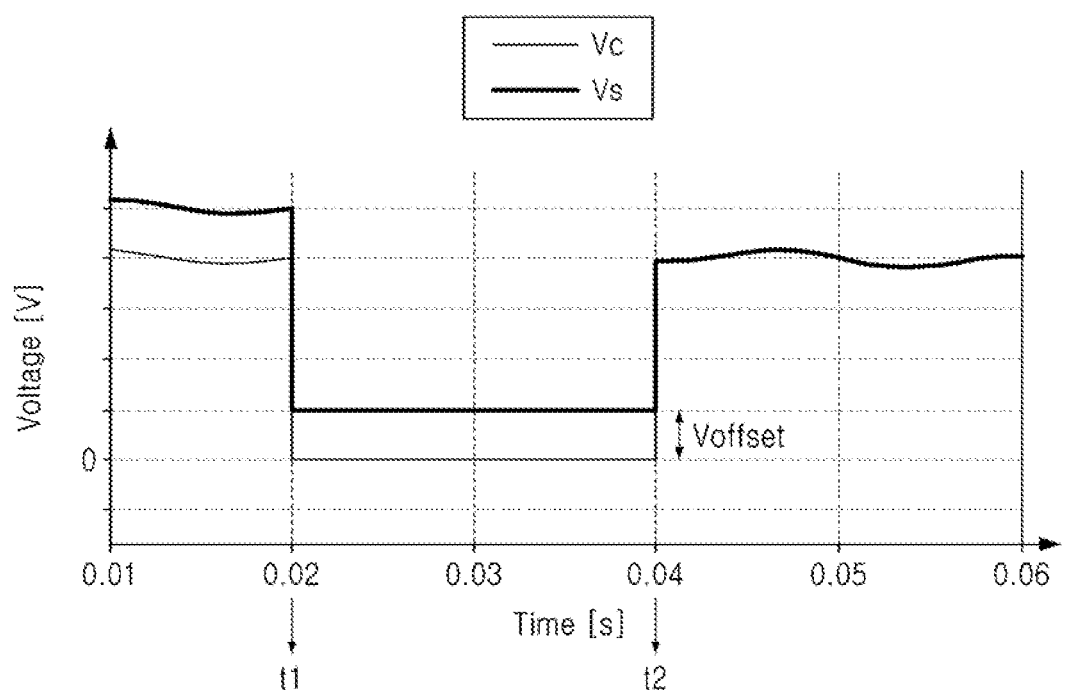
FIG. 12 is a diagram illustrating operations of a high voltage power supply apparatus according to an example embodiment.

FIG. 12 is a diagram illustrating operations of a high voltage power supply apparatus according to an example embodiment.

Referring to FIG. 12, a sensing voltage Vs and an output voltage Vc having different values may match at the same level according to the detection of and compensation for the offset voltage of the high voltage power supply apparatus in an example embodiment.

Referring to FIG. 12, at the first time point t1, the reference voltage detection switch may be turned on to detect the offset voltage OFFSET. At the second time point t2, the reference voltage detection switch may be turned off to compensate for the offset voltage OFF SET.

Before the first time point t1, i.e., before detecting and compensating for the offset voltage OFFSET, the magnitude of the sensing voltage Vs may be greater than the magnitude of the output voltage Vc, which may be the same between the first time point t1 and the second time point t2 in which the offset voltage OFFSET is detected.

The offset voltage OFFSET detected by the high voltage power supply apparatus in an example embodiment may be reflected in the sensing voltage Vc, and accordingly, the output voltage Vc and the sensing voltage Vs may match at the same level. That is, the output voltage Vc may be accurately sensed by the high voltage power supply apparatus in an example embodiment.

In general, if the high voltage power supply apparatus according to an example embodiment is not used, the dispersion of distribution of the sensing voltage may be detected to be about 2.5% to 3% level. Such dispersion of distribution of the sensing voltage may be a result according to a surrounding environment and/or conditions.

By comparison, when the offset voltage is compensated for using the high voltage power supply apparatus in an example embodiment, the dispersion of distribution of the sensing voltage may be reduced to about 0.3% to 0.7% level. Referring to the etching rate according to the dispersion of voltage distribution illustrated in FIG. 3, as the dispersion of distribution of sensing voltage improves, the dispersion of process distribution level may improve by about two or more times.

Figure 13:
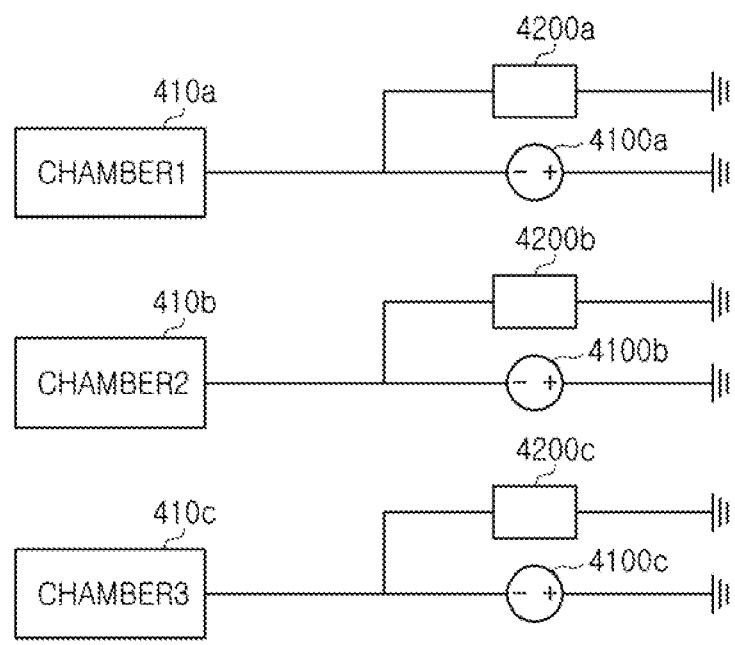
FIG. 13 is a diagram illustrating plasma etching equipment each including a high voltage power supply apparatus according to an example embodiment.

FIG. 13 is a diagram illustrating plasma etching equipment each including a high voltage power supply apparatus according to an example embodiment.

Referring to FIG. 13, the high voltage power supply apparatuses in an example embodiment may be included in different plasma etching devices. For example, high voltage DC voltage sources 4100a, 4100b, and 4100c and sensing circuit units 4200a, 4200b, and 4200c may be connected to different processing chambers 410a, 410b, and 410c, respectively.

Since each of the high voltage power supply apparatuses matches the sensing voltage and the output voltage at the same level by detecting and compensating for the offset voltage, the processing chambers 410a, 410b, and 410c may be applied with an output voltage of the same level from the high voltage DC voltage sources 4100a, 4100b, 4100c, and respectively. Accordingly, the high voltage power supply apparatuses in an example embodiment may improve the dispersion of overall process distribution of the etching process performed in the processing chambers 410a, 410b, and 410c.

The sensing circuit units 4200a, 4200b, and 4200c connected to the processing chambers 410a, 410b, and 410c may have the same structure. For example, the sensing circuit units 4200a, 4200b, and 4200c may be one of the sensing circuit units 3200A, 3200B, and 3200C included in the high voltage power supply apparatuses 3000A, 3000B, and 3000C illustrated in FIGS. 7 to 9, respectively.

In another implementation, the sensing circuit units 4200a, 4200b, and 4200c may have structures different from those of the sensing circuit units 3200A, 3200B, and 3200C included in the high voltage power supply apparatuses 3000A, 3000B, and 3000C illustrated in FIGS. 7 to 9, respectively. Also, at least one of the sensing circuit units 4200a, 4200b, and 4200c may have a structure different from that of the other sensing circuit units.

By way of summation and review, in a plasma etching process, to selectively control ion energy and to improve straightness of ions, a power supply apparatus having a non-sinusoidal output and a power supply apparatus outputting a high voltage of 4 kV or more depending on film quality of a thin film may be employed.

As described above, embodiments may provide a high voltage power supply apparatus including a sensing circuit including a reference voltage detection unit for detecting and compensating for an offset voltage of an output terminal, which may improve output accuracy and may improve dispersion of process distribution. Embodiments may also provide a plasma etching equipment having the high voltage power supply apparatus.

As described above, the high voltage power supply apparatus may, by detecting and compensating for the offset voltage of the output terminal, improve accuracy of the output voltage and may improve the dispersion of output distribution regardless of the surrounding environment and conditions. Also, the high voltage power supply apparatus may improve dispersion of process distribution between plasma etching equipment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A high voltage power supply apparatus, comprising:
a high voltage direct current voltage source;
a power switch configured to apply an output of the high voltage direct current voltage source to a process equipment; and
a sensing circuit unit, including:
a sensor unit including a sensor and at least one operational amplifier,
a reference voltage detection unit connected to a node between the sensor and the at least one operational amplifier, and
a digital signal processing unit,
wherein the sensing circuit unit is connected to an output terminal through which the output of the high voltage direct current voltage source is applied to the process equipment.

2. The high voltage power supply apparatus as claimed in claim 1, further comprising a loss reduction block configured to reduce switching loss of the power switch.

3. The high voltage power supply apparatus as claimed in claim 1, wherein the high voltage direct current voltage source and the power switch are connected to the process equipment in series.

4. The high voltage power supply apparatus as claimed in claim 1, wherein the process equipment includes an etching process equipment configured to perform etching using plasma generated based on the applied output.

5. The high voltage power supply apparatus as claimed in claim 1, wherein the at least one operational amplifier includes an impedance device configured to adjust a sensing level of the sensing circuit unit.

6. The high voltage power supply apparatus as claimed in claim 1, wherein the at least one operational amplifier includes a buffer connected to an output terminal of the sensor, and configured to output an input impedance applied from the sensor in a high impedance state.

7. The high voltage power supply apparatus as claimed in claim 1, wherein:
the reference voltage detection unit includes a reference voltage detection switch configured to detect a reference voltage, and
a switch control signal, generated by the digital signal processing unit, is applied to the reference voltage detection switch.

8. The high voltage power supply apparatus as claimed in claim 7, wherein the reference voltage detection switch includes a photoMOS relay.

9. A high voltage power supply apparatus, comprising:
a high voltage direct current voltage source configured to be electrically connected to a lower electrode of a processing chamber, and to apply an output to the lower electrode; and
a sensing circuit unit connected to an output terminal of the high voltage direct current voltage source, and including a reference voltage detection unit configured to detect an offset of a voltage applied to the lower electrode,
wherein the high voltage power supply apparatus is configured such that, after an RF power supply configured to apply a plasma generation voltage to an upper electrode of the processing chamber is activated, the sensing circuit unit detects the offset based on a control signal that is applied to the sensing circuit unit before the high voltage direct current voltage source is activated.

10. The high voltage power supply apparatus as claimed in claim 9, wherein:
the sensing circuit unit further includes:
a sensor unit including a sensor and at least one operational amplifier, and
a digital signal processing unit, and
the reference voltage detection unit is connected to a node between the sensor and the at least one operational amplifier.

11. The high voltage power supply apparatus as claimed in claim 9, wherein:
the reference voltage detection unit includes a reference voltage detection switch configured to detect a reference voltage, and
the reference voltage detection switch is controlled by a switch control signal according to whether the RF power supply and the high voltage direct current voltage source are activated.

12. The high voltage power supply apparatus as claimed in claim 11, configured such that after the RF power supply is activated, the reference voltage detection switch is turned on by the switch control signal.

13. The high voltage power supply apparatus as claimed in claim 12, configured such that when the reference voltage detection switch is turned on, the offset is calculated for a predetermined period of time.

14. The high voltage power supply apparatus as claimed in claim 13, wherein the predetermined period of time is between about 18 ms and 22 ms.

15. The high voltage power supply apparatus as claimed in claim 13, configured such that after the predetermined period of time elapses, the reference voltage detection switch is turned off by the switch control signal.

16. The high voltage power supply apparatus as claimed in claim 15, configured such tha when the reference voltage detection switch is turned off, the sensing circuit unit compensates a sensing voltage using the calculated offset.

17. The high voltage power supply apparatus as claimed in claim 16, configured such that the high voltage direct current voltage source is activated by the control signal after the sensing voltage is compensated.

18. The high voltage power supply apparatus as claimed in claim 16, configured such that the high voltage direct current voltage source applies an output to the lower electrode of the processing chamber based on the compensated sensing voltage.

19. A plasma etching equipment, comprising:
- a processing chamber including an upper electrode and a lower electrode, wherein the lower electrode is configured to receive a substrate on which a process is performed;
- a processing gas supply unit configured to supply a processing gas to the processing chamber;
- an RF power supply configured to apply a first voltage to the upper electrode to convert the processing gas into a plasma state; and
- a high voltage power supply apparatus including a sensing circuit unit connected between the lower electrode and a ground terminal, the high voltage power supply apparatus being configured to apply a second voltage to the lower electrode, the second voltage being compensated based on an offset voltage of the lower electrode that is detected by the sensing circuit unit.

20. The plasma etching equipment as claimed in claim 19, wherein the first voltage is an RF voltage, and the second voltage is a pulse voltage.

* * * * *